United States Patent
Schramme

(10) Patent No.: US 10,820,429 B2
(45) Date of Patent: Oct. 27, 2020

(54) COVER FOR A HOUSING, BATTERY SENSOR AND METHOD FOR PRODUCING A BATTERY SENSOR

(71) Applicant: Continental Automotive GmbH, Hannover (DE)

(72) Inventor: Martin Schramme, Königsbrunn (DE)

(73) Assignee: CONTINENTAL AUTOMOTIVE GMBH, Hannover (DE)

( * ) Notice: Subject to any disclaimer, the term of this patent is extended or adjusted under 35 U.S.C. 154(b) by 198 days.

(21) Appl. No.: 16/070,557

(22) PCT Filed: Feb. 20, 2017

(86) PCT No.: PCT/EP2017/053776
§ 371 (c)(1),
(2) Date: Jul. 17, 2018

(87) PCT Pub. No.: WO2017/162382
PCT Pub. Date: Sep. 28, 2017

(65) Prior Publication Data
US 2019/0029133 A1    Jan. 24, 2019

(30) Foreign Application Priority Data
Mar. 24, 2016   (DE) .................. 10 2016 204 942

(51) Int. Cl.
*H05K 3/30*        (2006.01)
*H05K 5/00*        (2006.01)
(Continued)

(52) U.S. Cl.
CPC ....... *H05K 5/0069* (2013.01); *G01R 31/3644* (2013.01); *H01M 10/425* (2013.01);
(Continued)

(58) Field of Classification Search
CPC ...... G01R 31/364; G01R 1/203; G01R 31/36; G01R 31/382; G01R 31/3835; G01R 19/0092
See application file for complete search history.

(56) References Cited

U.S. PATENT DOCUMENTS 4,596,429 A * 6/1986 Gierut ................ H01R 31/08
                                                        439/510
5,148,596 A * 9/1992 Zahn ...................... H01R 43/24
                                                        206/714
(Continued)

FOREIGN PATENT DOCUMENTS

DE      202004012466 U1    1/2005
DE      102006019895 A1    11/2007
(Continued)

OTHER PUBLICATIONS

Korean Office Action for Korean Application 10-2018-7022824, dated Sep. 26, 2019, with translation, 14 pages.
(Continued)

*Primary Examiner* — Alesa Allgood
(74) *Attorney, Agent, or Firm* — RatnerPrestia

(57) ABSTRACT

A cover for a housing including a number of press-fit pins which have at least two different press-fit zones. A battery sensor including a cover of this kind, and a method for producing a battery sensor are also disclosed.

17 Claims, 4 Drawing Sheets

(51) Int. Cl.
  *H01M 10/48* (2006.01)
  *H01R 11/28* (2006.01)
  *H01R 12/58* (2011.01)
  *H01M 10/42* (2006.01)
  *G01R 31/36* (2020.01)

(52) U.S. Cl.
  CPC ....... *H01M 10/4285* (2013.01); *H01M 10/48* (2013.01); *H01R 11/287* (2013.01); *H01R 12/585* (2013.01); *H05K 5/0043* (2013.01); H01M 2220/20 (2013.01)

(56) References Cited

U.S. PATENT DOCUMENTS

| | | | |
|---|---|---|---|
| 5,761,050 | A | 6/1998 | Archer |
| 6,305,949 | B1 | 10/2001 | Okuyama et al. |
| 8,079,883 | B2 * | 12/2011 | Pascut ................. H01R 13/424 439/752 |
| 8,932,086 | B2 | 1/2015 | Thimon et al. |
| 9,653,835 | B2 | 5/2017 | Kortlang |
| 10,082,542 | B2 | 9/2018 | Tanaka et al. |
| 2006/0091538 | A1 * | 5/2006 | Kabadi ................ H05K 7/1061 257/737 |
| 2010/0019733 | A1 | 1/2010 | Rubio |
| 2016/0139209 | A1 | 5/2016 | Tanaka et al. |

FOREIGN PATENT DOCUMENTS

| | | | |
|---|---|---|---|
| DE | 102007030924 A1 | 2/2009 | |
| DE | 102012223940 A1 | 6/2014 | |
| DE | 102012223940 A1 * | 6/2014 | ........... H01R 12/523 |
| DE | 102013015593 A1 | 4/2015 | |
| EP | 3012640 A1 | 4/2016 | |
| JP | H03263771 A | 11/1991 | |
| JP | 07325165 A | 12/1995 | |
| JP | 2005011587 A | 1/2005 | |
| JP | 2005188973 A | 7/2005 | |
| JP | 2008059776 A | 3/2008 | |
| JP | 2012531722 A | 12/2012 | |
| JP | 2013025974 A | 2/2013 | |
| KR | 20160023629 A | 3/2016 | |
| WO | 2014203465 A1 | 12/2014 | |
| WO | WO-2014203465 A1 * | 12/2014 | ............ B23K 20/10 |

OTHER PUBLICATIONS

Japanese Notice of Reasons for Refusal for Japanese Application No. 2018-543391, dated Jul. 30, 2019, with translation, 8 pages.
German Search Report for German Application No. 10 2016 204 942.9, dated Nov. 10, 2016, with partial translation—9 pages.
International Search Report and Written Opinion for International Application No. PCT/EP2017/053776, dated Apr. 25, 2017—14 pages.
Korean Grant of Patent for Korean Application No. 10-201B-7022824, dated Apr. 3, 2020, with translation, 3 pages.

* cited by examiner

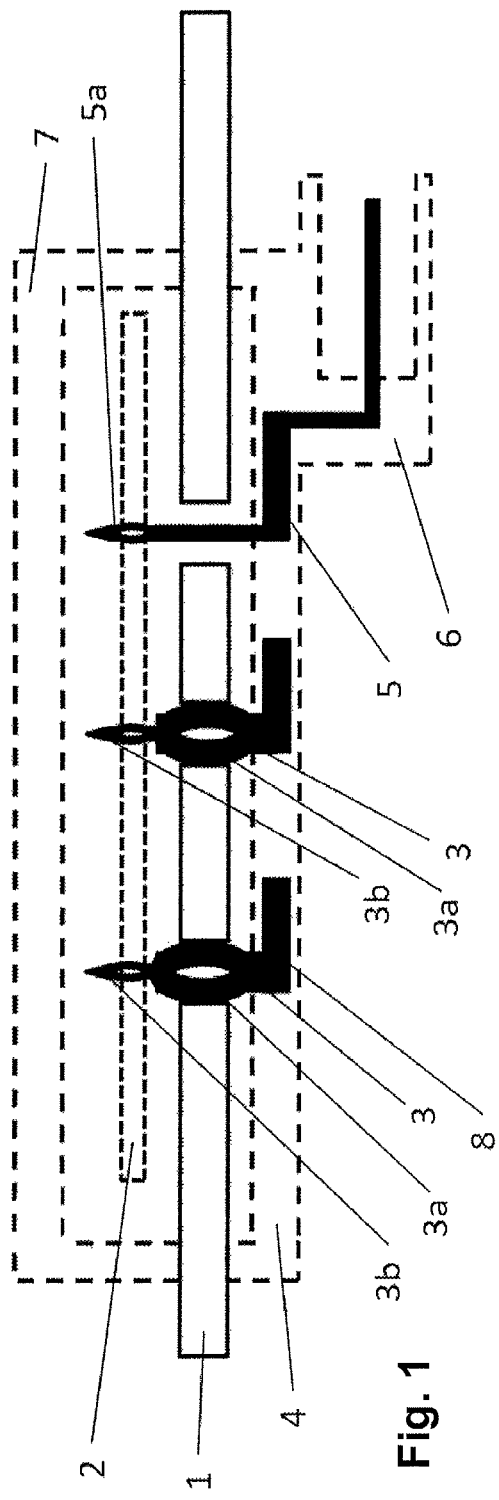
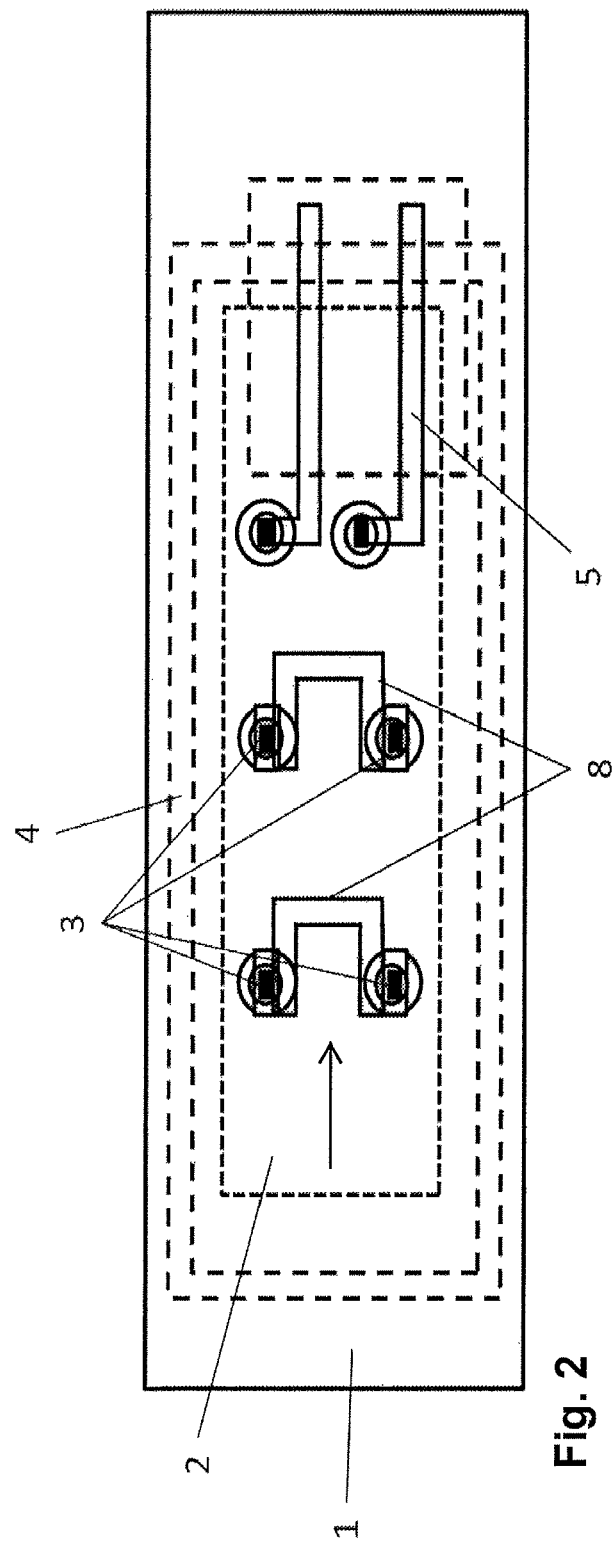

COVER FOR A HOUSING, BATTERY SENSOR AND METHOD FOR PRODUCING A BATTERY SENSOR

CROSS REFERENCE TO RELATED APPLICATIONS

This application is the U.S. National Phase Application of PCT International Application No. PCT/EP2017/053776, filed Feb. 20, 2017, which claims priority to German Patent Application No. 10 2016 204 942.9, filed Mar. 24, 2016, the contents of such applications being incorporated by reference herein.

FIELD OF THE INVENTION

The invention relates to a cover for a housing, to a battery sensor comprising a cover of this kind, and to a method for producing a battery sensor.

BACKGROUND OF THE INVENTION

Battery sensors are used in numerous electrical devices and, in particular, also in automobiles in order to measure currents with which a battery, such as a car battery for example, is charged or discharged. By way of example, a measurement resistor, also called a shunt, can be used in this case, the respective current flowing through said measurement resistor and a voltage which is dropped being measured by means of said measurement resistor. The through-flowing current can then be inferred using Ohm's law.

A measurement resistor of this kind can be designed, for example, in the form of a solid metal electrical conductor. In this case, there is often the problem of connecting said measurement resistor to a printed circuit board, wherein the measurement resistor and the printed circuit board are intended to be arranged in a common housing and the printed circuit board is also intended to be contacted by a plug which is integrated into the housing.

By way of example, known press-fit connections can be used for this purpose. One important feature of press-fit connections is the so-called press-fit zone which can be configured, for example, in the shape of an eye. Said press-fit zone is a structure which is stamped into the pin and which is firstly thicker than the pin itself in at least one direction and secondly permits elastic deformation by means of which the holding forces of the press-fit connection are realized.

For some years, press-fit connections have also been used in battery sensors, specifically in two fundamentally different types of application. Firstly, electrical connections from the measurement resistor to the printed circuit board are required in order to carry the voltage which is dropped across the measurement resistor to the printed circuit board and to measure and to evaluate said voltage by means of the components which are located on said printed circuit board. Secondly, electrical connections from the printed circuit board to a plug are required, by means of which electrical connections the printed circuit board is supplied with the battery voltage and a communications interface is connected.

The plug is generally integrated into a housing in which the printed circuit board and the measurement resistor are also located. Contact pins of the plug are typically stamped out of a leadframe and provided with press-fit contacts at one end. In further working steps, the measurement resistor can then likewise be provided with press-fit contacts which were previously produced by stamping and which are welded, for example, onto the measurement resistor. The leadframe and the measurement resistor can then be encapsulated by injection molding with the housing material such that the press-fit zones of all of the pins protrude into the interior of the housing and there lie level with the intended position of the printed circuit board. In subsequent working steps, the printed circuit board can be pressed into the housing with the press-fit pins and closed by a cover.

It has been found that the embodiments according to the prior art have the disadvantage, in particular, that production of the pins for the measurement resistor, production of the pins for the plug, connection of the pins of the measurement resistor to the measurement resistor and encapsulation of the measurement resistor and leadframe by injection molding with the housing in each case take place in dedicated working processes, this leading to particularly complex process control overall.

SUMMARY OF THE INVENTION

Therefore, an aspect of the invention aims to provide a cover with which simpler execution and/or process control are/is possible. A further aspect of the invention aims to provide a battery sensor comprising a cover of this kind. Yet a further aspect of the invention aims to provide an associated method for producing a battery sensor.

An aspect of invention relates to a cover for a housing. The cover has a carrier structure and a number of press-fit pins which protrude from the carrier structure. The carrier structure is sheathed by a cover material. Each press-fit pin of a first group of press-fit pins in each case has a first press-fit zone and a second press-fit zone, wherein the first press-fit zone is arranged closer to the carrier structure than the second press-fit zone. The first press-fit zone has a larger maximum cross-sectional area than the second press-fit zone.

By means of the cover according to an aspect of the invention, it is particularly easily possible to contact two adjacent electrical components, such as a printed circuit board and a measurement resistor for example, by means of the press-fit pins at the same time. To this end, a first component can be contacted by means of the first press-fit zone and a second component can be contacted by means of the second press-fit zone for example. This can take place in a very simple manufacturing process. This will be discussed in more detail further below.

In this case, a press-fit zone is typically a zone which is designed to be connected to another component, for example a printed circuit board or a measurement resistor. To this end, a respective press-fit zone is typically designed with a cross section which initially rises and then drops again as seen in the longitudinal direction of the press-fit pin. The maximum cross section therefore typically refers to a respective plane transverse in relation to the longitudinal direction of the press-fit pin. In this case, the press-fit zones are preferably elastic, so that particularly advantageous contact can be established.

The press-fit pins of the first group are preferably formed in a materially cohesive manner with the carrier structure. This allows simple production and reliable electrical connection. In particular, the carrier structure and the press-fit pins of the first group can be stamped or formed from a common metal sheet. Particularly when using stamping-out methods, mention may also be made of a leadframe structure which comprises both the carrier structure and also the associated press-fit pins.

According to one development, each press-fit pin of a second group of press-fit pins has a cross-sectional area which is consistently smaller than the maximum cross-sectional area of the first press-fit zone. This allows the press-fit pins of the second group of press-fit pins to be used to contact only one of two components which is contacted by the press-fit pins of the first group. To this end, in particular, a respective press-fit pin of the second group can pass through correspondingly large holes in the component which is not to be contacted, and can be connected to a component which is to be contacted.

According to one embodiment, the second group comprises at least one pair of press-fit pins which are arranged next to one another. This has been found to be expedient for typical applications. In particular, a connecting line between the press-fit pins of one pair can be transverse in relation to a direction of current of a battery sensor. This prevents the introduction of asymmetries which could influence the current flow in a manner which is difficult to predict. Instead of a pair of press-fit pins, an arrangement of more than two, for example three, four or more, press-fit pins can also be used. These can also have a connecting line which is transverse in relation to a direction of current of a battery sensor.

The press-fit pins of the second group can also be connected in a materially cohesive manner to the carrier structure.

The first press-fit zone and the second press-fit zone can respectively be at a distance from one another. However, the first press-fit zone can also respectively directly adjoin the second press-fit zone. It will be understood that these embodiments can also be combined with one another when there are several press-fit pins.

According to one embodiment, the first group comprises four press-fit pins which are arranged in a first pair and a second pair one behind the other. This has been found to be advantageous for typical applications. In particular, connecting lines between the respective press-fit pins of each pair can be oriented transversely in relation to a direction of current, this allowing measurement at the same potential. Owing to the use of a pair of press-fit pins, the respective current-carrying capacity can be increased, in particular doubled, without having to switch to a different thickness of a metal sheet. The press-fit pins of a respective pair can be, in particular, interconnected, for example by corresponding design of the carrier structure, this being advantageous if they measure at the same potential.

Instead of a pair, more than two, for example three, four or more, press-fit pins can also be used in each case. These can also have a connecting line which is transverse in relation to a direction of current of a battery sensor and they can be interconnected.

According to one development, the cover further has an integrated plug. This can serve, in particular, to establish an electrical connection between components which are located within a housing and components which are external to said housing.

In particular, the press-fit pins of the second group can be connected to electrical conductors of the plug. This allows specific contacting of one of the components by means of the plug.

The carrier structure preferably connects a number of press-fit pins to other pins and/or other electrical conductors. This allows flexible and simple production also of more complex electrical connections between press-fit pins and other electrical conductors.

According to one advantageous embodiment, the cover is connected to a first joining partner and a second joining partner. In this case, the first press-fit zones are advantageously pressed into the first joining partner and the second press-fit zones are advantageously pressed into the second joining partner. If press-fit pins of the second group are present, these are preferably pressed into the second joining partner, but, as an alternative or in addition thereto, can also be pressed into the first joining partner. This allows an advantageous arrangement in which the two joining partners are connected to one another and possibly to other components by means of the press-fit pins of the first group and in which the second joining partner can be separately connected to external components.

By way of example, the first joining partner can be a measurement resistor. Similarly, the second joining partner can be a printed circuit board. This has been found to be advantageous specifically for applications in a battery sensor.

The cover can be, in particular, part of a housing which encloses an interior space. A housing of this kind can, in particular, provide mechanical protection and can furthermore be sealed off against the ingress of liquid and/or harmful substances.

An aspect of the invention furthermore relates to a battery sensor which has a measurement resistor and a measurement circuit which is configured to measure a voltage which is dropped across at least a portion of the measurement resistor.

According to an aspect of the invention, it is provided in the case of the battery sensor that the measurement resistor is in the form of part of a housing which encloses the measurement circuit. In this case, the battery sensor has a lower and/or an upper cover, wherein the measurement resistor and the cover or the covers together form the housing. According to an aspect of the invention, at least one of the covers is designed in accordance with an aspect of the invention. In this case, it is possible to refer back to all of the described embodiments and variants of a cover. In this case, the first press-fit zones are typically pressed into the measurement resistor and the measurement circuit is preferably mounted on a printed circuit board into which the second press-fit zones are pressed.

By means of the battery sensor according to an aspect of the invention, the advantages described further above of a cover according to an aspect of the invention can be utilized for a battery sensor. In particular, the measurement circuit can measure a voltage which is dropped across the measurement resistor, so that a through-flowing current can be inferred. Said measurement resistor may be, in particular, a long-term and/or a temperature-stable measurement resistor, or said measurement resistor may be a less stable measurement resistor which is continuously calibrated.

According to one preferred embodiment, the press-fit pins of the second group are connected to electrical conductors of a plug, and press-fit zones of the press-fit pins of the second group are pressed into the printed circuit board. This particularly advantageously allows the printed circuit board to be connected to components which are situated outside the battery sensor separately from the measurement resistor. By way of example, the printed circuit board can be connected to a vehicle electronics system by means of the press-fit pins of the second group. There is no electrical connection to the measurement resistor here, this also not being desired in this case. Paired arrangement of the press-fit pins of the second group with a connecting line transverse in relation to a direction of current of the battery sensor can, in particular, prevent asymmetries which could influence measurements in a manner which is difficult to determine.

According to a preferred embodiment, the first group comprises four press-fit pins which are arranged in a first pair and a second pair one behind the other. In this case, it is particularly preferably provided that the first pair is arranged in front of the second pair as seen in a direction of current of the battery sensor, a connecting line between the press-fit pins of the first pair is oriented transversely in relation to the direction of current, and a connecting line between the press-fit pins of the second pair is oriented transversely in relation to the direction of current. Therefore, the press-fit pins of a respective pair can in particular measure at the same potential. Owing to the use of pairs of press-fit pins, the current-carrying capacity is increased without having to resort to thicker material.

An aspect of the invention furthermore relates to a method for producing a battery sensor, in particular a battery sensor according to an aspect of the invention, wherein it is possible to refer back to all of the described embodiments and variants. The method has the following steps:

providing a cover according to an aspect of the invention, wherein it is possible to refer back to all of the described variants and embodiments, pressing the first press-fit zones into a measurement resistor, and pressing the second press-fit zones into a printed circuit board.

This method allows particularly advantageous production of a battery sensor, in particular a battery sensor according to an aspect of the invention. Owing to the particular design of the cover with the correspondingly designed press-fit pins, it is possible to contact both the measurement resistor and also the printed circuit board by simple plug-mounting. In this case, good electrical contacts are also formed, these being particularly advantageous for reliable functioning over a typical period of use.

The individual features of an aspect of the invention allow, in particular in one working process, production of a housing with integrated press-in pins for two or more joining partners which are intended to be electrically connected to one another. In this context, it should be noted that the press-fit pins can, in principle, also have more than two press-fit zones which can be correspondingly continued, wherein a press-fit zone which is arranged respectively further away from the cover or from a carrier structure typically has a smaller maximum cross section than the press-fit zones which are situated respectively closer to the cover or the carrier structure.

The leadframe can particularly advantageously be designed for all of the provided electrical connections at the same time and injected into the housing. The housing can then be closed by a cover. In this case, the following working processes which are typically required according to the prior art are dispensed with: separate production of one or more pins for connecting the measurement resistor to the printed circuit board and of a leadframe for plug-in contacts; mounting the pins on the measurement resistor; fixing the measurement resistor with the contacts to the leadframe.

Instead, a leadframe having all of the required pins is advantageously produced in one go and the housing is injection molded around said leadframe. In two further work processes, in particular, first the measurement resistor and then the printed circuit board can be pressed into the housing. Finally, the housing can be closed by a cover.

BRIEF DESCRIPTION OF THE DRAWINGS

Further features and advantages will be gathered by a person skilled in the art from the exemplary embodiments described below with reference to the appended drawing, in which:

FIG. 1: shows a cross-sectional view through a cover according to an aspect of the invention, FIG. 2: shows a plan view of the cover of FIG. 1;

DETAILED DESCRIPTION OF THE PREFERRED EMBODIMENTS

Figure 3:
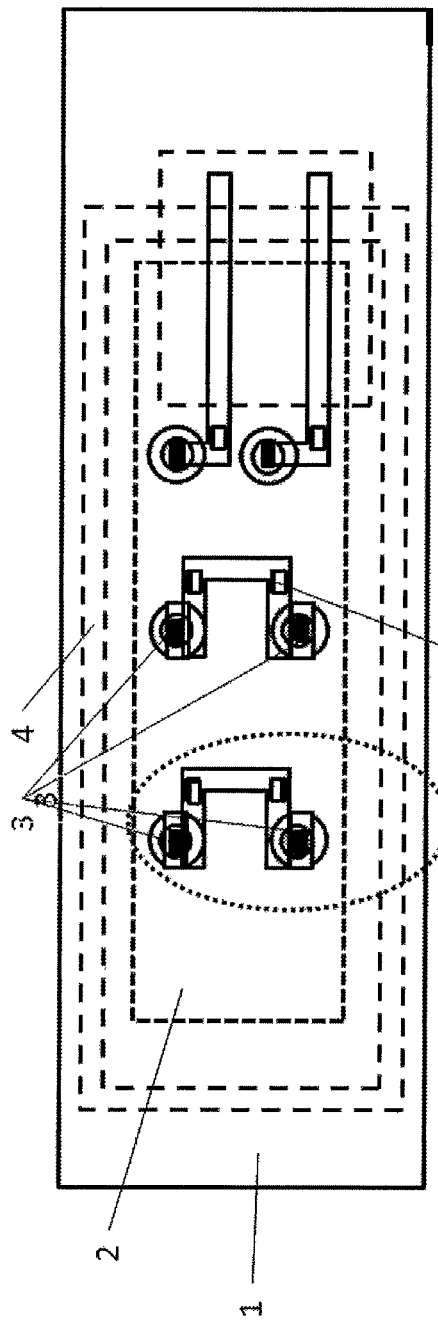
FIG. 3: shows the view from FIG. 2 with an indicated region.

FIG. 1 shows how a first joining partner in the form of a measurement resistor 1 and a second joining partner in the form of a printed circuit board 2 are connected to one another by means of a cover 4 according to an aspect of the invention. A number of press-fit pins 3 of a first group of press-fit pins is arranged in the cover 4 according to an aspect of the invention. Each press-fit pin 3 of the first group has a respective first press-fit zone 3a and a respective second press-fit zone 3b. In this case, the respective second press-fit zone 3b is at a further distance from the base plate of the cover 4 than the respective first press-fit zone 3a.

Furthermore, the respective first press-fit zone 3a has a higher maximum cross section than the respective second press-fit zone 3b. In this case, the cross section is seen transverse in relation to a longitudinal extent of the respective press-fit pin 3.

The press-fit pins 3 of the first group are electrically connected to a carrier structure 8 and also connected to further components, this not being illustrated in any detail. The carrier structure 8 is accommodated in the cover 4 by encapsulation by injection molding. This allows flexible contacting and electrical and mechanical protection.

Furthermore, the cover 4 has a number of press-fit pins 5 of a second group of press-fit pins. The respective press-fit pins 5 of the second group each have only one press-fit zone 5a which, in respect of its design, that is to say in particular with respect to distance and maximum cross section, corresponds to the respective second press-fit zone 3b of the press-fit pins 3 of the first group of press-fit pins.

Furthermore, the cover 4 has a plug 6, wherein conductors of the plug 6 are connected to the press-fit pins 5 of the second group of press-fit pins.

The cover 4 forms a housing 7 together with further components which are not described in any detail. Said housing encloses an interior space in which, in particular, the printed circuit board 2 is located and beyond which the measurement resistor 1 projects in the present case.

As shown, the measurement resistor 1 is connected to the respective first press-fit zones 3a of the press-fit pins 3 of the first group of press-fit pins by these first press-fit zones 3a being pressed into the measurement resistor 1. As shown, the measurement resistor 1 is contacted at two points along its longitudinal extent in the present case as a result, this allowing, in particular, measurement of a voltage which is dropped across a portion of the measurement resistor 1.

The printed circuit board 2 is connected both to the second press-fit zones 3b of the press-fit pins 3 of the first group of press-fit pins and also to the press-fit zones 5a of the press-fit pins 5 of the second group of press-fit pins. The first situation allows an electronics system which is located on the printed circuit board 2 to measure the voltage which is dropped across the corresponding portion of the measurement resistor 1. The second situation allows contacting of the printed circuit board 2 from the outside.

In this case, it should be in particular noted and is also clearly shown in FIG. 1 that the press-fit pins 5 of the second group of press-fit pins are not contact-connected to the measurement resistor 1, but rather pass through corresponding holes in the measurement resistor 1. This is made possible in a simple manner by the advantageous design shown.

FIG. 2 shows a plan view of the cover 4 of FIG. 1. Said figure clearly shows that a total of four press-fit pins 3 of the first group of press-fit pins are present, said four press-fit pins being arranged in two pairs. Said figure also shows that two press-fit pins 5 of the second group of press-fit pins are present, said two press-fit pins being arranged in one pair. Reference is made to the description of FIG. 1 in respect of the details.

A typical direction of current flow is indicated by an arrow in FIG. 2.

Figure 4:
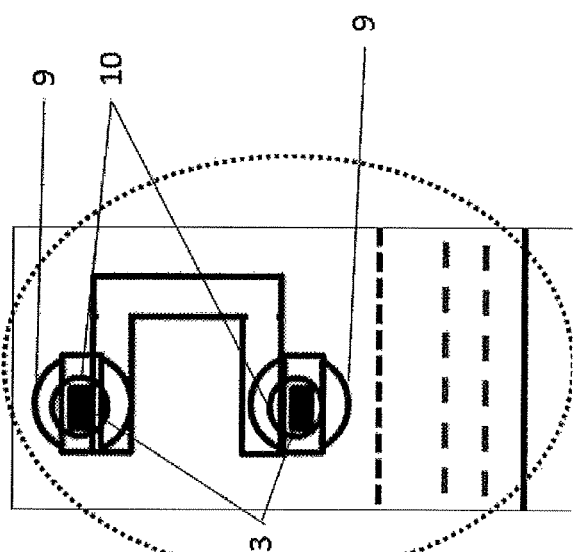
FIG. 4: shows an enlarged illustration of the indicated region from FIG. 3.

FIG. 3 shows the same illustration as FIG. 2, but a region which is illustrated on an enlarged scale in FIG. 4 is additionally indicated in FIG. 3.

FIG. 4 shows an enlarged illustration of the arrangement of two press-fit pins 3 of the first group of press-fit pins. Said figure shows, in particular, that the press-fit pins 3 are in contact both with first press-fit holes 9, which are formed in the measurement resistor 1, and also with second press-fit holes 10, which are formed in the printed circuit board 2. This makes possible the above-described advantageous electrical connection for measuring a voltage.

Figure 5:
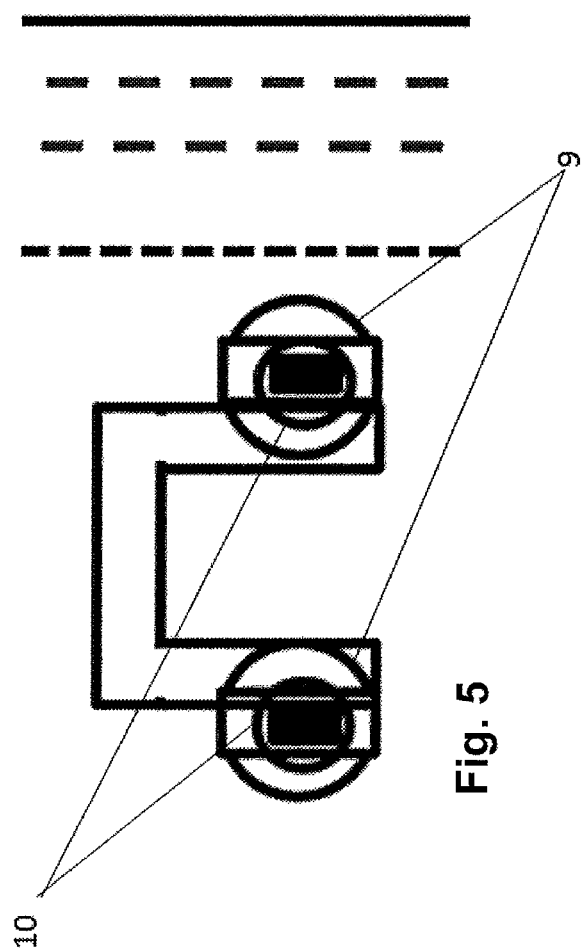
FIG. 5: shows a partial view of the cover.

FIG. 5 shows a yet further enlarged view of the illustration from FIG. 4. Reference is made to the above description in respect of the details. Said figure shows, in particular, that the first press-fit holes 9 are substantially larger than the second press-fit holes 10, this also applying to the corresponding maximum cross sections of the first and second press-fit zones 3a, 3b. This makes possible the above-described manner of contact-connection.

Figure 6:
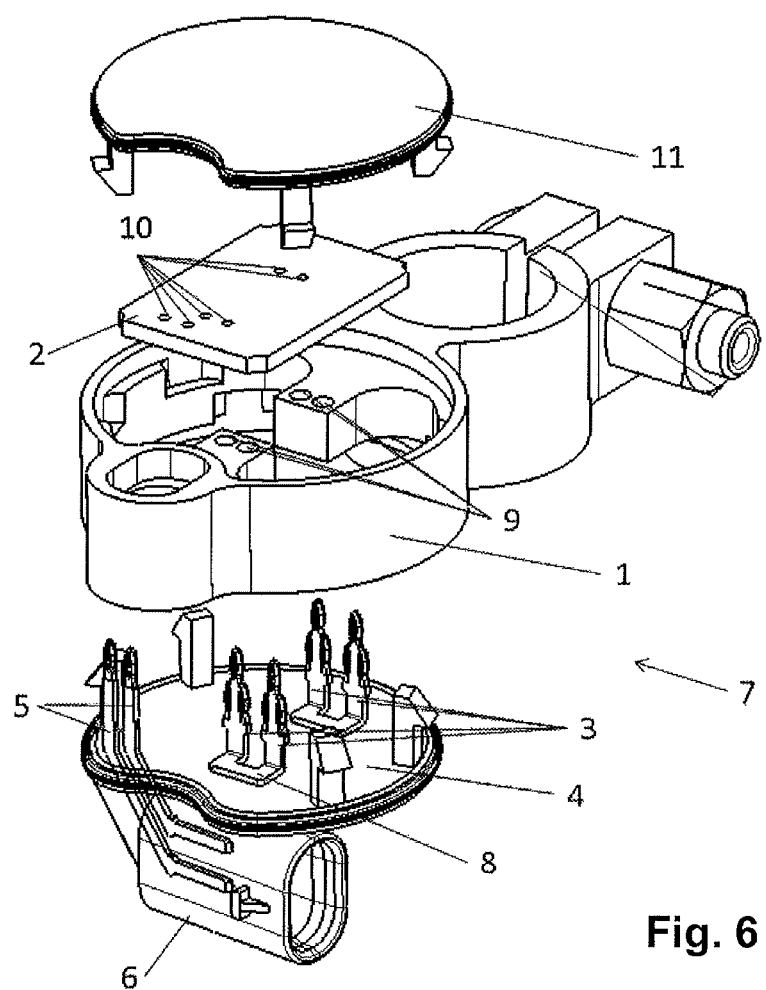
FIG. 6: shows a battery sensor.

FIG. 6 shows an exemplary embodiment of a battery sensor according to an aspect of the invention. Said figure shows the cover 4 from which the total of four press-fit pins 3 of the first group of press-fit pins and the two press-fit pins 5 of the second group of press-fit pins protrude.

A measurement resistor 1 in which the four first press-fit holes 9 for receiving the first press-fit zones 3a of the press-fit pins 3 of the first group are formed is formed above the cover 4. The printed circuit board 2 in which a total of six second press-fit holes 10 are arranged is arranged directly above said measurement resistor. Said second press-fit holes serve to receive the second press-fit zones 3b of the press-fit pins 3 of the first group and also the press-fit zones 5a of the press-fit pins 5 of the second group. The electrical contact-connection already mentioned above can be established in this way.

The fact that the measurement resistor 1 constitutes part of the housing 7 is worth mentioning in respect of the embodiment shown. This allows an advantageous, compact and leaktight design. In order to be completed, the housing 7 further has a further cover 11 which is mounted on the measurement resistor 1 from above. Both the cover 4 and also the further cover 11 are each clipped to the measurement resistor 1 by clip connectors shown. Therefore, a compact and leaktight housing results in the assembled state.

It will be understood that the press-fit pins 5 of the second group of press-fit pins can also be called plug-in contacts. The two covers 4, 11 are typically situated on respective planar surfaces of the measurement resistor 1. The covers 4, 11 can be shaped, for example, in the form of a trough.

In the shown exemplary embodiment of FIG. 1, the measurement resistor projects out of the housing 7 on several sides. This is especially advantageous for an apparatus for current measurement because supply lines for the current to be measured can advantageously be connected to the portion of the measurement resistor which projects out of the housing 7. Electrical components other than a measurement resistor 1 can also be used in principle and can advantageously be connected to the printed circuit board 2. Said electrical components can both project out of the housing 7 and also not project out of the housing 7.

In the case of the embodiment of FIG. 6, it should be mentioned in particular that the cover 4 with an integrated plug 6 has a carrier structure 8 with press-fit pins 3 of the first group of press-fit pins which, in a first working process with a relatively thick press-in zone or the first press-fit zones 3a, can be pressed into the four first press-fit holes 9 of the measurement resistor 1 which are provided therefor. The printed circuit board 2 with the press-fit holes 10 which are provided therefor can then be pressed into the thinner press-in zones or second press-fit zones 3b at the end of the respective press-fit pins 3. At the same time, the press-fit pins 5 of the second group of press-fit pins, which press-fit pins 5 are connected to electrical conductors of the plug 6, can be pressed into the printed circuit board 2. Finally, the arrangement is closed by the further cover 11.

FIG. 6 clearly shows that the press-fit pins 3 of the first group are arranged one behind the other in two pairs, wherein the press-fit pins of each pair are electrically connected to one another by means of the carrier structure 8. In the embodiment shown, a direction of current runs transverse in relation to the respective connecting lines between press-fit pins 3 of a respective pair. The advantages mentioned further above are achieved in this way.

It is understood that, instead of press-fit pins with two press-fit zones or one press-fit zone, more than two press-fit zones, for example with an increasing thickness, can be cascaded so that multiple press-fit pins or multiple press-in pins for three or more joining partners are created.

Mentioned steps of the method according to an aspect of the invention can be executed in the indicated order. However, they can also be executed in a different order. In one of its embodiments, for example with a specific combination of steps, the method according to an aspect of the invention can be executed in such a way that no further steps are executed. However, in principle, further steps can also be executed, even steps of a kind which have not been mentioned.

The claims that are part of the application do not represent any dispensing with the attainment of further protection.

If it turns out in the course of proceedings that a feature or a group of features is not absolutely necessary, then the applicant aspires right now to a wording for at least one independent claim that no longer has the feature or the group of features. This may be, by way of example, a subcombination of a claim present on the filing date or may be a subcombination of a claim present on the filing date that is limited by further features. Claims or combinations of features of this kind requiring rewording can be understood to be covered by the disclosure of this application as well.

It should further be pointed out that configurations, features and variants of an aspect of the invention that are described in the various embodiments or exemplary embodiments and/or shown in the figures can be combined with one another in any way. Single or multiple features can be interchanged with one another in any way. Combinations of features arising therefrom can be understood to be covered by the disclosure of this application as well.

Back-references in dependent claims are not intended to be understood as dispensing with the attainment of independent substantive protection for the features of the back-referenced subclaims. These features can also be combined with other features in any way.

Features that are disclosed only in the description or features that are disclosed in the description or in a claim only in conjunction with other features may fundamentally be of independent significance essential to aspects of the invention. They can therefore also be individually included in claims for the purpose of distinction from the prior art.

The invention claimed is:

1. A cover for a housing, comprising:
   a carrier structure, and
   a number of press-fit pins which protrude from the carrier structure,
   wherein the carrier structure is sheathed by a cover material,
   wherein each press-fit pin of a first group of press-fit pins in each case has a first press-fit zone and a second press-fit zone, wherein the first press-fit zone is arranged closer to the carrier structure than the second press-fit zone, and wherein the first press-fit zone has a larger maximum cross-sectional area than the second press-fit zone,
   wherein the cover is connected to a first joining partner and a second joining partner, wherein the first joining partner is a measurement resistor and the second joining partner is a printed circuit board, and
   wherein the first press-fit zones are pressed into the first joining partner and the second press-fit zones and also press-fit zones of the press-fit pins of a second group are pressed into the second joining partner.

2. The cover as claimed in claim 1, wherein
   the first press-fit zone and the second press-fit zone are respectively at a distance from one another;
   or
   the first press-fit zone directly adjoins the respective second press-fit zone.

3. The cover as claimed in claim 1, wherein
   the first group comprises four press-fit pins which are arranged in a first pair and a second pair one behind the other.

4. The cover as claimed in claim 1, wherein
   the cover further has an integrated plug.

5. The cover as claimed in claim 1, wherein
   the carrier structure connects a number of press-fit pins to other pins and/or other electrical conductors.

6. The cover as claimed in claim 1, wherein
   the cover is part of a housing which encloses an interior space.

7. The cover as claimed in claim 1, wherein
   the press-fit pins of the first group of press-fit pins are formed in a materially cohesive manner with the carrier structure.

8. The cover as claimed in claim 7, wherein each press-fit pin of a second group of press-fit pins has a cross-sectional area which is consistently smaller than the maximum cross-sectional area of the first press-fit zone; and
   wherein the second group comprises a pair of press-fit pins which are arranged next to one another.

9. The cover as claimed in claim 1, wherein
   each press-fit pin of a second group of press-fit pins has a cross-sectional area which is consistently smaller than the maximum cross-sectional area of the first press-fit zone;
   wherein the second group comprises a pair of press-fit pins which are arranged next to one another.

10. The cover as claimed in claim 9, wherein
    further has an integrated plug, and
    the press-fit pins of the second group are connected to electrical conductors of the plug.

11. A battery sensor, having
    a measurement resistor, and
    a measurement circuit which is configured to measure a voltage drop across at least a portion of the measurement resistor,
    wherein
    the measurement resistor is in the form of part of a housing which encloses the measurement circuit,
    wherein the battery sensor has a lower and/or an upper cover, wherein the measurement resistor and the cover or the covers together form the housing, and
    wherein at least one of the covers is designed as claimed in claim 1, the first press-fit zones are pressed into the measurement resistor, and the measurement circuit is mounted on a printed circuit board into which the second press-fit zones are pressed.

12. A method for producing a battery sensor as claimed in claim 11, the method comprising:
    providing a cover comprising:
    a carrier structure, and
    a number of press-fit pins which protrude from the carrier structure,
    wherein the carrier structure is sheathed by a cover material, and
    wherein each press-fit pin of a first group of press-fit pins in each case has a first press-fit zone and a second press-fit zone, wherein the first press-fit zone is arranged closer to the carrier structure than the second press-fit zone, and wherein the first press-fit zone has a larger maximum cross-sectional area than the second press-fit zone,
    pressing the first press-fit zones into a measurement resistor, and
    pressing the second press-fit zones into a printed circuit board.

13. The battery sensor as claimed in claim 11, wherein at least one of the covers further has an integrated plug, and the press-fit pins of the second group are connected to electrical conductors of the plug and press-fit zones of the press-fit pins of the second group are pressed into the printed circuit board.

14. The battery sensor as claimed in claim 13, wherein the at least one of the covers comprises four press-fit pins which are arranged in a first pair and a second pair one behind the other, the first pair is arranged in front of the second pair as seen in a direction of current of the battery sensor, a connecting line between the press-fit pins of the first pair is oriented transversely in relation to the direction of current, and a connecting line between the press-fit pins of the second pair is oriented transversely in relation to the direction of current.

15. A method for producing a battery sensor as claimed in claim 13, the method comprising:
    providing a cover comprising:
    a carrier structure, and
    a number of press-fit pins which protrude from the carrier structure,
    wherein the carrier structure is sheathed by a cover material, and
    wherein each press-fit pin of a first group of press-fit pins in each case has a first press-fit zone and a second press-fit zone, wherein the first press-fit zone is arranged closer to the carrier structure than the second press-fit zone, and wherein the first press-fit zone has a larger maximum cross-sectional area than the second press-fit zone, pressing the first press-fit zones into a measurement resistor, and pressing the second press-fit zones into a printed circuit board.

16. The battery sensor as claimed in claim 11, wherein the at least one of the covers comprises four press-fit pins which are arranged in a first pair and a second pair one behind the other, the first pair is arranged in front of the second pair as seen in a direction of current of the battery sensor, a connecting line between the press-fit pins of the first pair is oriented transversely in relation to the direction of current, and a connecting line between the press-fit pins of the second pair is oriented transversely in relation to the direction of current.

17. A method for producing a battery sensor as claimed in claim 16, the method comprising:

providing a cover comprising:

a carrier structure, and a number of press-fit pins which protrude from the carrier structure, wherein the carrier structure is sheathed by a cover material, and wherein each press-fit pin of a first group of press-fit pins in each case has a first press-fit zone and a second press-fit zone, wherein the first press-fit zone is arranged closer to the carrier structure than the second press-fit zone, and wherein the first press-fit zone has a larger maximum cross-sectional area than the second press-fit zone, pressing the first press-fit zones into a measurement resistor, and pressing the second press-fit zones into a printed circuit board.

* * * * *